United States Patent [19]

Hitchcock

[11] Patent Number: 4,939,779
[45] Date of Patent: Jul. 3, 1990

[54] TEMPERATURE COMPENSATED TRAP FILTER

[76] Inventor: Bernard K. Hitchcock, 201 Alton Street, Syracuse, N.Y. 13215

[21] Appl. No.: 354,113

[22] Filed: May 19, 1989

[51] Int. Cl.$^5$ ............................................. H04K 3/00
[52] U.S. Cl. ............................................ 380/7; 380/10
[58] Field of Search ........................................ 380/7, 10

[56] References Cited

U.S. PATENT DOCUMENTS

| | | | |
|---|---|---|---|
| 3,061,767 | 12/1959 | Toro | 317/247 |
| 3,989,887 | 11/1976 | Murphy | 380/7 |
| 4,085,011 | 4/1978 | Juergens et al. | 204/37 |
| 4,097,894 | 6/1978 | Tanner et al. | 358/118 |
| 4,268,860 | 5/1981 | Blonder | 380/10 |
| 4,581,795 | 4/1986 | Mobbs et al. | 29/25 |
| 4,748,667 | 5/1988 | Farmer et al. | 380/7 |
| 4,825,468 | 4/1989 | Ellis | 380/7 |
| 4,837,820 | 6/1989 | Bellavia, Jr. | 380/10 |

Primary Examiner—Thomas H. Tarcza
Assistant Examiner—David Cain
Attorney, Agent, or Firm—Kenyon & Kenyon

[57] ABSTRACT

A temperature stable television signal trap filter device is easily produced in a wide range of temperature compensating values using commercially available components for securing pay television systems. The trap filter has a series pole and a shunt pole capacitively coupled to the series pole. A first parallel capacitor circuit having a total capacitance and a total temperature compensating value forms a capacitive part of the series pole and a second parallel capacitor circuit forms a part of the shunt pole. Both the first and second parallel capacitor circuit include a first standard capacitor having a first standard temperature compensating value coupled in series with a first branch of the parallel capacitor circuit and a second standard capacitor having a second standard temperature compensating value coupled in series with a second branch of the parallel capacitor circuit. The first and second standard capacitors provide an exact desired total temperature compensating value for the parallel capacitor circuit to pass a desired frequency band in the outdoor use of the trap filter.

19 Claims, 2 Drawing Sheets

TEMPERATURE COMPENSATED TRAP FILTER

FIELD OF THE INVENTION

This invention relates to cable television security filter circuits and, more particularly, to a temperature compensated trap or notch filter for outdoor use in a cable television system. The design and implementation of the temperature compensated filter of the present invention achieves a narrow, symmetrical notch filter having high stability due to the precise temperature compensation in its poles.

BACKGROUND OF THE INVENTION

Cable video systems often employ trap or notch filters to prevent a pay channel from reaching nonsubscribers or to descramble channels using interfering carrier scrambling signals. These filters block the particular pay channel but allow the other channels to pass. Due to the inductance/capacitance (LC) networks used in the filter devices, temperature variations produce a change in the capacitance which alters the performance of the filter circuit. This variation with temperature is further compounded by the outdoor use of such trap filters when employed in cable television systems.

It has therefore become necessary to use temperature componsating capacitors in the poles of the filter circuit. However, the design of a filter circuit with properly compensated trap filters has been a very time consuming and labor intensive process.

Standard temperature compensating capacitors are generally available in three (3) compensation values designed by an "N" (negative compensation) number. The typical N values are 0, 75, and 150. The N value denotes the temperature coefficient range expressed in parts per million per degree centigrade (ppm/°C.).

Prior design processes for trap filters begin by first determining the electrical parameters for proper trap operation. Next, the components of the trap filter are compensated for temperature variations which occur in the outdoor use of the filters. The compensating step includes a search for a proper coil (L) and capacitor (C) combination in each of the filter poles that achieves the desired temperature compensation. However, because standard ceramic capacitors used in trap filters are only available in limited temperature compensations, i.e. NPO, N75 and N150, the compensation process for the trap filter circuit almost becomes a trial and error approach, or at best a poor compromise.

Further, during the compensation process several negative results occur. These negative results often include the creating of a lopsided notch due to the series pole becoming unsymmetrical with respect to the shunt, i.e. ground pole; and the lopsided notch causing interference with adjacent frequencies in the cable television system and further causing the trap filter to lose some of its stability. Overall in the production and manufacturing of trap filters, the circuit compensation is never perfectly achieved.

Thus there is a need for a highly stable and symmetrical trap filter with precise temperature compensation. Further, the design of such a temperature compensating trap filter must be possible using standard ceramic capacitors having a limited range of temperature compensating values. There also is a need for a design process which can be accomplished without excess time delays or manpower allotments.

SUMMARY OF THE INVENTION

The problems of the prior art are overcome by the temperature compensated trap filter of the present invention. The trap filters of the present invention can be designed for any N-pole filter.

The design process begins by first calculating the electrical parameters which will pass the desired frequency band in the trap filter. During this calculation, a parallel capacitor circuit is used in at least one of the poles of the filter device for determining the capacitance of that particular pole. Generally, the capacitors in the parallel circuit are initially chosen with one having a zero compensation value (NPO) and the other having a negative compensation value (N75 or N150). Once the electrical parameters of the filter are established, the filter is then tested for proper electrical operation.

The trap filter circuit is then compensated for temperature variations in its outdoor use by determining the proper temperature compensating value necessary in each pole of the trap filter. In practice, this value is rarely equal to those standard compensating values commercially available for ceramic capacitors. Because of this fact, the design process of the present invention makes use of standard capacitors having different capacitances and temperature compensating values in the branches of the parallel circuits. These standard ceramic capacitors are commercially available in a broad selection of capacitance ranges although only in the limited number of compensation values discussed above. Therefore, using different capacitors in each branch of the parallel circuit, the exact capacitance and temperature compensating value necessary for the circuit can be obtained via interpolation.

By the above process, a properly compensating trap filter is achieved in a short design time. Further, the trap filter's notch is symmetrical thus providing high stability for the filter.

It is a further advantage that the compensation of the circuit is nearly prefect. This allows the trap filter to achieve higher frequencies, i.e., decreasing the trap bandwidth allows higher channels to be used by the cable television system before unallowable degradation of adjacent signals occurs.

DETAILED DESCRIPTION OF THE INVENTION

Figure 1:
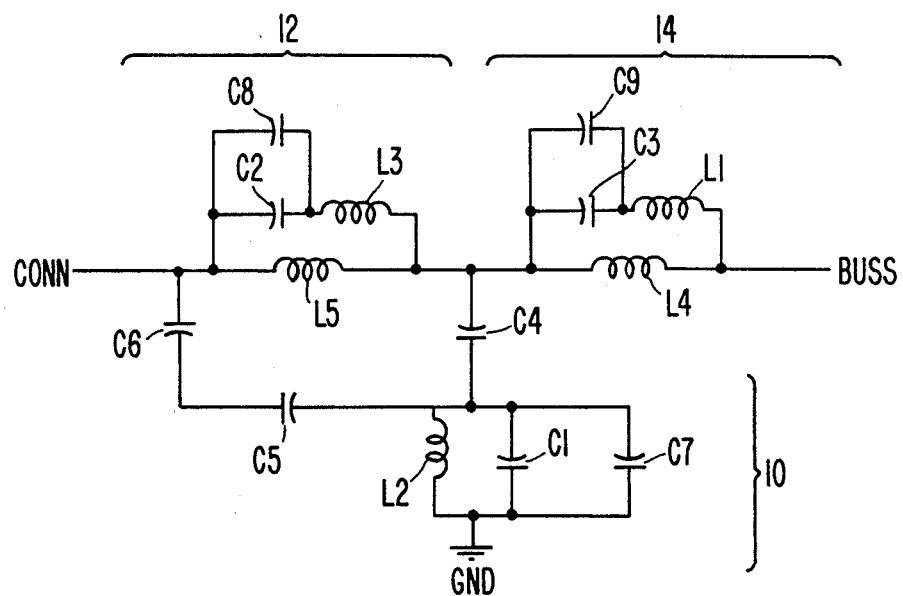
FIG. 1 is a schematic circuit diagram of a three pole filter of the present invention.

Referring to FIG. 1, there is shown a circuit diagram of a three-pole trap filter of the present invention. The filter circuit has three poles designated generally as 10, 12 and 14. The three poles 10, 12, 14 include two series poles 12 and 14 and a ground or shunt pole 10. The filter circuit further includes a female end denoted "CONN" and a male end denoted "BUSS".

One of the series poles 12 includes capacitor C2 and adjustable coil L3 coupled in a series relationship with each other. Another coil L5 is coupled in parallel with capacitor C2 and adjustable coil L3. Further, capacitor C8 is coupled in parallel across capacitor C2.

Series pole 14 is identical to series pole 12 and contains parallel capacitor circuit C3 and C9 as well as adjustable coils L1 and L4.

The shunt or ground pole 10 includes a parallel circuit having an adjustable coil L2 in a first branch and a capacitor C1 in a second branch. Further, capacitor C7 is coupled in parallel across capacitor C1 and across coil L2. One end of the shunt pole is coupled to a ground (GND) and the other end is capacitively coupled through capacitors C4, C5 and C6 to the series pole circuits 12 and 14.

The use of capacitors C7, C8 and C9 coupled in parallel with capacitors C1, C2 and C3 respectively, provides a means for achieving a precise temperature compensating value for the filter circuit. It is understood by those skilled in the art that a parallel capacitor circuit for each pole of the trap filter is not always necessary. Rather, if by compensating only a single pole, i.e. either 10, 12 or 14, the trap filter is properly compensated, then the other parallel circuits are not necessary. However, the use of the three parallel circuits shown in FIG. 1 illustrates the most flexible design approach for the trap filter.

Figure 2:
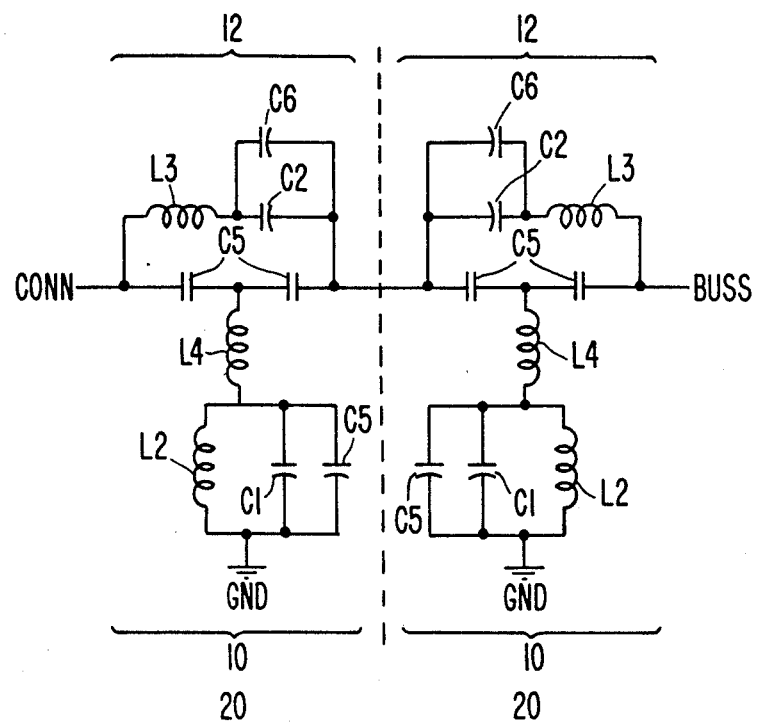
FIG. 2 is a schematic circuit diagram of a four-pole filter of the present invention.

Referring to FIG. 2, there is shown a schematic diagram of a four-pole filter circuit. The four-pole filter is divided into two filter areas 20 and 22. As is well known, the use of some type of isolation means (shown by dotted line) is necessary between the two sections 20 and 22 of the filter when tuning the filter. Each section of the four-pole filter includes a series pole 12 and a shunt pole 10. As discussed with the three-pole device, the shunt pole 10 incudes the parallel circuit having an adjustable coil L2 in a first branch and a capacitor C1 in a second branch. Further, an additional capacitor C5 is coupled in parallel across capacitor C1.

The series pole 12 includes an adjustable coil L3 coupled in series with a capacitor C2. A capacitor 65 is coupled in parallel across adjustable coil L3 and capacitor C2. Further, an additional capacitor C6 is coupled in parallel with capacitor C2. The series pole 12 is inductively coupled through inductor C4 to the shunt pole 10.

Filter area 22 is a mirror reflection of filter area 20. Area 22 has been labelled using the same reference numbers as in filter area 20.

As described with respect to the three pole device, the use of the additional capacitors C5 and C6 coupled in parallel across capacitors C1 and C2 respectively in each pole 10 and 12, is merely illustrative of the most flexible approach for designing the trap filter. Again, it is apparent that if the trap filter can be properly compensated using only a single parallel capacitor, then FIG. 2 would be simplified as such.

Figure 3:
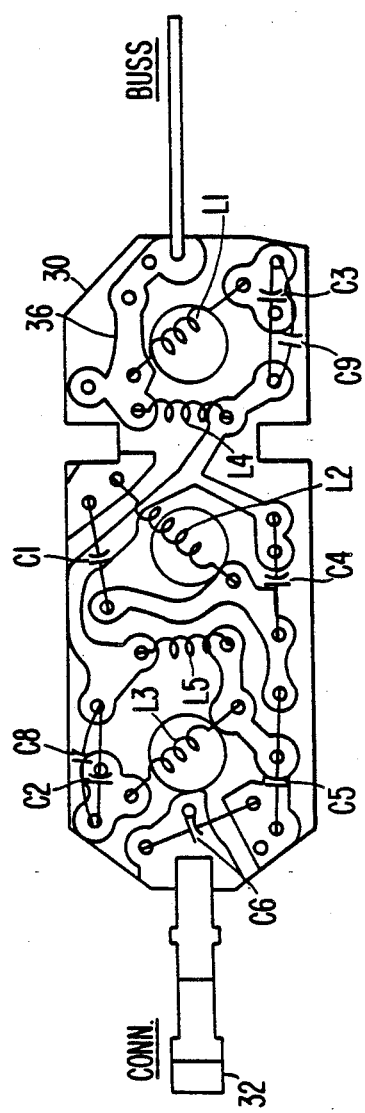
FIG. 3 is a top plan view of the component side of a printed circuit board employing the three pole filter of FIG. 1.

FIG. 3 shows the plan view of a printed circuit board 30 incorporating the three-pole filter as described in FIG. 1. The printed circuit board 30 includes metallized areas 36 (shaded areas) for coupling the circuit components together. The metallized areas form the signal leads for the trap filter.

As can be seen from FIG. 3, the parallel capacitor circuits comprising capacitors C2 and C8, C1 and C7, and C3 and C9 are packed closely together on the printed circuit board 30. The spacing between the parallel capacitors should be at a minimum distance to prevent any inductance from being introduced into the circuit.

The use of parallel capacitors allows precise temperature compensation for the trap filter. Further, the precise compensation is available using only standard, commercially available, ceramic capacitors having a limited number of temperature compensating values.

An example of the design process for the trap filter shown in FIG. 3 will now be described with respect to only one of the parallel capacitor circuits referenced above. The design begins by first preparing a printed circuit board 30 for the type of trap filter device desired. Our example describes a three pole trap filter as shown in FIGS. 1 and 3. The electrical components of the filter are then placed on the circuit board 30 and the electrical operation of the filter is tested.

Each of the parallel capacitor circuits have a total capacitance and a total temperature compensating value across its terminals. The relationships for the parallel capacitor circuit are described as follows:

$$C_k = C1 + C2 \qquad (1)$$

$$\alpha_k = \frac{C1\alpha_1 + C2\alpha_2}{C1 + C2} \qquad (2)$$

where C1 and C2 are the capacitances of the first and second standard capacitors and $\alpha 1$ and $\alpha 2$ are the standard temperature compensating values for C1 and C2 respectively. $C_k$ is defined as the total capacitance of the capacitor circuit and $\alpha_k$ is the total temperature compensating value of the parallel capacitor circuit.

During the electrical design phase of the trap filter, one branch of the parallel circuit includes a capacitor having a zero temperature compensating value (NPO) and the other branch has a capacitor with one of the limited compensating values commercially available.

Once the trap filter is properly designed electrically, then the temperature compensating design process begins. As can be seen from Equations (1) and (2), by substituting capacitors having different capacitance values into parallel circuit, a total capacitance value (the sum of the capacitors) is achieved for the parallel circuit. Further, in accordance with Equation (2), a total compensating value is achieved for the parallel circuit. Depending upon the values of each capacitor used in the parallel circuit, a wider range of capacitances and temperature compensating values are made available over those commerically available. Because there are a variety of commercially avilable capacitors having different capacitances (but only limited temperaure compensating values), the required temperature compensating value and capacitance value for the trap filter operation can be obtained. The filter designer can thus interpolate commerically available capacitor values to obtain the exact values required for the proper operation of the trap filter.

Another compensating procedure begins by assembling two identical trap filters having a zero value temperature compensating capacitor in their poles. The first trap filter is first selected and one of its poles is tuned to the exact desired frequency. The second pole of the trap filter is tuned out of the bandwidth. The second identical trap filter then has its second pole, i.e. the pole that was tuned out of the bandwidth on the first device, tuned to the exact desired frequency. The first pole, i.e.

the pole that was tuned to the exact frequency on the first device, is then tuned out of the bandwidth. Therefore, the two identical trap filter devices have their respective poles oppositely tuned. The outdoor temperature at which the devices would operate is then varied over a set range, e.g. minus 40°F.–70®F., and the movements of the individual poles over the temperature range are recorded.

The above process is then repeated using termperature compensating capacitors that will overcompensate for the variation in temperature. For example, either an N75 or an N150 capacitor is used in the filter poles. The overcompensating value can often be approximated from the operator's experience in dealing with a specific frequency range. The result of repeating the process produces another record of the pole movement over the same temperature range.

By comparing the records of movement of the uncompensated and compensated poles, the operator can interpolate the exact N value required of the temperature compensating filter. Once the exact compensating value is determined, then the filter designer can select standard capacitors having standard compensating values to be used in the parrallel capacitor circuit in each of the poles to obtain a precisely compensated trap filter device.

As one example of the above process, the cable channel "J" in a four-pole filter may require a 22 picofarad (pF) capacitor having a negative temperature compensating value of N75 ppm/°C. in its shunt pole. If an increase in the total temperature compensation is desired, various possibilities are available with commercially available components as described in the following examples:

Ex. 1

C1 = 10 N 150 in the first branch of the parallel circuit.
C2 = 12 N 75 in the second branch of the parallel circuit.

or

Ex. 2

C1 = 8 N 150 in the first branch of the parallel circuit.
C2 = 14 N 75 in the second branch of the parallel circuit.

Placing these capacitors in the parallel circuit produces total values of $C_k=22$ pF and $\alpha_k 109$ ppm/°C. in first example and $C_k=22$ pF and $\alpha_K=102$ ppm/°C. in the second example according to the interpolating Eqs. (1) and (2). Thus, by using different capacitance values while incorporating the limited range of temperature compensating values, i.e. 0, 75 and 150, in the parallel circuit, a full range of total values can be achieved for the trap filters. The use of the parallel circuit greatly simplifies the design process because it allows standard commercially available compoments to be used. Further, the precise temperature compensation of the present invention allows narrow three decibal filtering points and the obtaining of higher channels. Also, interpolating for the correct value produces a notch which is symmetrical and thus more stable than conventional filter devices having an equal number of poles.

Figure 4:
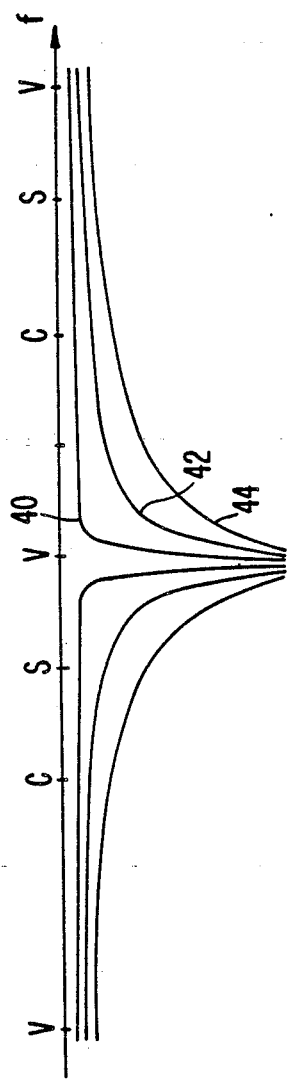
FIG. 4 is a diagram illustrating the performance characteristics of the present invention.

FIG. 4 shows the filter characteristics of the present invention as compared to conventional trap filters. The graph of the present invention shows a highly narrow notch 40 for the video (V) portion of the frequency. Conventional trap filters, as represented by 42 and 44, have wider notches which therefore interfere with the color (C) and sound (S) portions of the frequency signal.

What is claimed is:

1. A method for creating a wide range of capacitances and temperature compensating values in the production of a temperature stable television signal trap filter device for use in securing pay television systems, the method comprising the steps of:
    (a) calculating the electrical parameter for passing a desired frequency band in said trap filter device using at least one parallel capacitor circuit in said trap filter device, said parallel capacitor circuit having a total capacitance and a total temperature compensting value:
    (b) testing said electrical parameters of the trap filter device until said trap filter devices electrically operates properly; and
    (c) compensating for temperature variations in the outdoor use of said trap filter device while continuing to pass the desired frequency band using at least two standard capacitors each having a temperature compensating value by:
        i. placing a first one of said standard capacitors having a first standard temperature compensating value in a first branch of said parallel capacitor circuit,
        ii. placing a second one of said standard capacitors having a second standard temperature compensating value in a second branch of said parallel capacitor circuit, and
        iii. interpolating an exact desired total temperature compensating value while continuing to pass the desired frequency band in said filter device using said standard capacitors.

2. A method according to claim 1 wherein said step of compensating for temperature variations uses standard ceramic capacitors.

3. A method according to claim 2 wherein said step of interpolating is carried out according to the relationships:

$$\alpha_k = \frac{C1\alpha_1 + C2\alpha_2}{C1 + C2}$$
$$C_k = C1 + C2$$

wherein C1 and C2 are the capacitances of the first and second standard capacitors and $\alpha 1$ and $\alpha 2$ are the standard temperature compensating values for C1 and C2 respectively, $C_k$ is the total capacitance of said parallel capacitor circuit and $\alpha_k$ is the total temperature compensating value of said parallel capacitor circuit.

4. A temperature stable television signal trap filter device easily produced in a wide range of temperature compensating values using commercially available components for securing pay television systems, comprising:
    (a) a series pole;
    (b) a shunt pole capacitively coupled to said series pole;
    (c) a first parallel capacitor circuit having a total capacitance and a total temperature compensating value forming a capacitive part of said series pole;
    (d) said first parallel capacitor circuit further including:
        i. a first standard capacitor having a first standard temperature compensating value coupled in a first branch of said parallel capacitor circuit;

ii. a second standard capacitor having a second standard temperature compensating value coupled in a second branch of said parallel capacitor circuit wherein said first and second standard capacitors provide an exact desired total temperature compensating value for the parallel capacitor circuit to pass a desired frequency band in the outdoor use of said trap filter.

5. A trap filter device according to claim 4 further comprising:
   (a) a second parallel capacitor circuit having a total capacitance and a total temperature compensating value forming a capacitive part of said shunt pole;
   (b) said second parallel capacitor circuit further including:
      i. a first standard capacitor having a first standard temperature compensating value coupled in a first branch of said parallel capacitor circuit;
      ii. a second standard capacitor having a second standard temperature compensating value coupled in a second branch of said parallel capacitor circuit wherein said first and second standard capacitors provide an exact desired total temperature compensating value for the parallel capacitor circuit to pass a desired frequency band in the outdoor use of said trap filter.

6. A trap filter device according to claim 5 wherein said trap filter is a multiple pole device including a parallel capacitor circuit in at least one of said multiple poles.

7. A trap filter device according to claim 6 wherein said trap filter is a three pole device including a parallel capacitor circuit in each pole.

8. A trap filter device according to claim 6 wherein said trap filter is a four pole device including a parallel capacitor circuit in each pole.

9. A trap filter device according to claim 5 wherein said first and second standard capacitors each have a negative temperature compensating value.

10. A trap filter device according to claim 5 wherein either said first or second standard capacitors have a negative temperature compensating value and the other standard capacitor has a positive temperature compensating value.

11. A trap filter device according to claim 5 wherein either said first or second standard capacitors have a negative temperature compensating value and the other standard capacitor has a zero temperature compensating value.

12. A trap filter device according to claim 5 wherein said first and second standard capacitors are made of a ceramic.

13. A trap filter device according to claim 12 wherein said first and second standard ceramic capacitors are chosen according to the relationships $$\alpha_k = \frac{C1\alpha_1 + C2\alpha_2}{C1 + C2}$$
$$C_k = C1 + C2$$

wherein C1 and C2 are the capacitances of the first and second standard capacitors and α1 and α2 are the standard temperature compensating value for C1 and C2 respectively, $C_k$ is the total capacitance of said parallel capacitor circuit and $\alpha_k$ is the total temperature compensating value of said parallel capacitor circuit.

14. A method for creating a wide range of capacitances and temperature compensating values in the production of a temperature stable television signal trap filter device for use in securing pay television systems, the method comprising the steps of:
   (a) designing the circuit layout for an N-pole trap filter device;
   (b) calculating the electrical parameters for passing a desired frequency band in said trap filter device using at least one parallel capacitor circuit in said trap filter device, said parallel capacitor circuit having a total capacitance and a total temperature compensating value;
   (c) selecting at least two standard capacitors for use in said parallel capacitor circuit;
   (d) placing said standard capacitors on a printed circuit board in accordance with the design of said trap filter device;
   (e) testing said electrical parameters of the trap filter device until said trap filter device electrically operates properly; and
   (f) compensating for temperature variations in the outdoor use of said trap filter device while continuing to pass the desired frequency band using at least two standard capacitors each having a temperature compensating value by:
      i. placing a first one of said standard capacitors having a first standard temperature compensating value in a first branch of said parallel capacitor circuit,
      ii. placing a second one of said standard capacitors having a second standard temperature compensating value in a second branch of said parallel capacitor circuit, and
      iii. interpolating an exact desired total temperature compensating value while continuing to pass the desired frequency band in said filter device using said standard capacitors.

15. A method according to claim 14 wherein said step of compensating for temperature variations uses standard ceramic capacitors.

16. A method according to claim 15 wherein said step of interpolating is carried out according to the relationships:

$$\alpha_k = \frac{C1\alpha_1 + C2\alpha_2}{C1 + C2}$$
$$C_k = C1 + C2$$

wherein C1 and C2 are the capacitances of the first and second standard capacitors and α1 and α2 are the standard temperature compensating values for C1 and C2 respectively, $C_k$ is the total capacitance of said parallel capacitor circuit and $\alpha_k$ is the total temperature compensating value of said parallel capacitor circuit.

17. A method of compensating for temperature variations occuring in the outdoor use of device, a temperature stable television signal trap filter device passing a bandwidth, the method comprising the steps of:
   (a) assembling a first and a second trap filter device, both of said trap filter devices being identical and including a first and a second pole having zero value temperature compensating capacitors;
   (b) choosing the first trap filter device and selectively tuning the first pole to an exact desired frequency and tuning the second pole out of the bandwidth;

(c) choosing the second trap filter device and tuning the first pole out of the bandwidth and the second pole to the exact desired frequency;

(d) recording the movement of said poles in each of said trap filters when varying the operating temperature over a set range;

(e) repeating steps (b)–(d) for said first and second trap filter devices using an overcompensating temperature compensating capacitor in the pole tuned to the exact desired frequency; and (f) interpolating an exact compensating capacitor value from said recorded movements for said pole tuned to the exact desired frequency.

18. A method according to claim 17 further comprising the step of:

(g) obtaining the exact compensating capacitor value using at least two standard capacitors each having a temperature compensating value by:
   i. placing a first one of said standard capacitors having a first standard temperature compensating value in a first branch of a parallel capacitor circuit in said tuned pole,
   ii. placing a second one of said standard capacitors having a second standard temperature compensating value in a second branch of a parallel capacitor circuit in said tuned pole, and
   iii. interpolating an exact desired total temperature compensating value while continuing to pass the exact desired frequency in said filter device using said standard capacitors.

19. A method according to claim 18 wherein said standard capacitors are ceramic capacitors.

* * * * *